(12) United States Patent
Chou et al.

(10) Patent No.: US 10,345,688 B2
(45) Date of Patent: Jul. 9, 2019

(54) LIGHT EMITTING APPARATUS USING COMPOSITE MATERIAL

(71) Applicant: Unique Materials Co., Ltd., Taipei (TW)

(72) Inventors: Pi-Tai Chou, Taipei (TW); Shang-Wei Chou, Taipei (TW)

(73) Assignee: Unique Materials Co., Ltd., Taipei (TW)

( * ) Notice: Subject to any disclaimer, the term of this patent is extended or adjusted under 35 U.S.C. 154(b) by 0 days.

(21) Appl. No.: 15/490,766

(22) Filed: Apr. 18, 2017

(65) Prior Publication Data

US 2018/0299755 A1  Oct. 18, 2018

(51) Int. Cl.
| | |
|---|---|
| *G03B 21/20* | (2006.01) |
| *G02B 26/00* | (2006.01) |
| *G02B 1/04* | (2006.01) |
| *C09K 11/02* | (2006.01) |
| *C09K 11/88* | (2006.01) |
| *F21V 9/30* | (2018.01) |
| *F21V 14/08* | (2006.01) |
| *H01L 33/50* | (2010.01) |
| *H01L 33/56* | (2010.01) |
| *B82Y 20/00* | (2011.01) |
| *F21S 10/00* | (2006.01) |
| *B82Y 30/00* | (2011.01) |

(52) U.S. Cl.
CPC .......... *G03B 21/204* (2013.01); *C09K 11/025* (2013.01); *C09K 11/883* (2013.01); *F21V 9/30* (2018.02); *F21V 14/08* (2013.01); *G02B 1/04* (2013.01); *G02B 26/008* (2013.01); *H01L 33/502* (2013.01); *H01L 33/56* (2013.01); *B82Y 20/00* (2013.01); *B82Y 30/00* (2013.01); *F21S 10/007* (2013.01); *H01L 2933/0083* (2013.01); *Y10S 977/774* (2013.01); *Y10S 977/81* (2013.01); *Y10S 977/812* (2013.01); *Y10S 977/814* (2013.01); *Y10S 977/816* (2013.01); *Y10S 977/818* (2013.01); *Y10S 977/819* (2013.01); *Y10S 977/82* (2013.01); *Y10S 977/823* (2013.01); *Y10S 977/824* (2013.01); *Y10S 977/892* (2013.01); *Y10S 977/95* (2013.01)

(58) Field of Classification Search
CPC ....... G02B 26/008; H01L 33/50; H01L 33/52; H01L 33/56; H01L 33/502
See application file for complete search history.

(56) References Cited

U.S. PATENT DOCUMENTS

| | | | |
|---|---|---|---|
| 2015/0261076 A1* | 9/2015 | Dijken | ......... H01L 33/507 359/326 |
| 2016/0032183 A1* | 2/2016 | Ghosh | ......... C09K 11/025 438/47 |
| 2017/0153382 A1* | 6/2017 | Wang | ......... H01L 25/0753 |

* cited by examiner

*Primary Examiner* — Anne M Hines
(74) *Attorney, Agent, or Firm* — J.C. Patents

(57) ABSTRACT

The invention provides a light emitting apparatus including a projector color wheel and a light emitting diode (LED) device using a composite material, a method of manufacturing the composite material, and an optical film. The stability of the composite material has been greatly improved. Light emitting devices using the composite material have wide color gamut.

17 Claims, 7 Drawing Sheets

LIGHT EMITTING APPARATUS USING COMPOSITE MATERIAL

BACKGROUND OF THE INVENTION

1. Field of the Invention

The present invention generally relates to a light emitting apparatus including a projector color wheel and a light emitting diode (LED) device using a composite material.

2. Description of Related Art

Projector is a display device used for producing large size images. A projector is to convert an illumination beam produced by a light source module into an image beam by using a light valve, and project the image beam onto a screen or a wall through a projection lens to form an image.

In order to produce illumination beams of three primary colors (red, blue, green), some projectors are configured with color wheels. The projector color wheel has a plurality of light converting regions (for example, filter regions or phosphor regions). The light converting regions are able to convert, for example, an incident beam produced by the light source into the required color beam.

When in operation, the projector color wheel is exposed to high temperature (up to 180° C.) and intensive light within the projector. Similarly, the surface temperature of a light emitting diode (LED) chip can be up to 120° C., with intensive illumination of light emitted from the LED chip. Currently, phosphors are used in combination with a blue light source to produce a white light. In order to improve the color gamut, it is desirable to use quantum dots (QDs) instead of the conventional phosphors. However, the high temperature and the intensive light will damage the QDs very quickly. In the situation, the luminance of the QDs will be lost permanently.

SUMMARY OF THE INVENTION

The invention provides a light emitting apparatus including a projector color wheel and a light emitting diode (LED) device using a composite material. The composite material including quantum dots is able to improve the color gamut of the projector color wheel when compared with the conventional phosphors. In addition, the thermal stability is enhanced by using silica ($SiO_2$) material to encapsulate the quantum dots.

The projector color wheel of the invention includes a plurality of color converters and a rotating portion. The color converters are arranged to form a disk configuration. Each of the color converters includes a composite material including at least one quantum dot and a silica material. A surface of the at least one quantum dot is encapsulated by the silica material. The rotating portion is disposed at a center of the disk configuration.

In an embodiment of the invention, the color converters are arranged as an annular shape which surrounds a circumference of the rotating portion.

In an embodiment of the invention, one of the color converters is an opening for permitting light to pass through the opening or a reflective surface for permitting light to reflect without changing the color of the light beam.

In an embodiment of the invention, a number of the at least one quantum dot is plural, and the quantum dots are dispersed uniformly in the silica material.

In an embodiment of the invention, a particle size of the composite material ranges from 10 nm to 500 μm.

In an embodiment of the invention, the color converters include a first color converter having a first composite material and a second color converter having a second composite material. The first composite material differs from the second composite material.

In an embodiment of the invention, an emission wavelength of the at least one quantum dot of the first composite material differs from an emission wavelength of the at least one quantum dot of the second composite material.

In an embodiment of the invention, the at least one quantum dot includes core structure, core-shell structure, core-multishell structure, alloy structure, core-alloy layer-shell structure, core-alloy layer-multishell structure, core-gradient alloy-shell structure, or a combination thereof.

In an embodiment of the invention, the at least one quantum dot includes a core structure and a shell structure covering the core structure. The core structure is selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof. The shell structure is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof.

In an embodiment of the invention, the at least one quantum dot includes perovskite.

In an embodiment of the invention, the composite material further comprises a silicon resin covering a surface of the silica material, so as to enhance thermal endurance of the color converters and be easily moulded into various shapes and sizes depending on the application.

The light emitting diode (LED) device of the invention includes a LED chip and a composite material. The composite material is disposed onto the LED chip. The composite material comprises a plurality of quantum dots and a modification-free silica material encapsulating surfaces of the quantum dots.

In an embodiment of the invention, the modification-free silica material includes an inorganic polymer made from tetramethyl orthosilicate (TMOS) or tetraethyl orthosilicate (TEOS).

In an embodiment of the invention, the composite material is capable of withstanding a temperature of 25° C. to 260° C.

In an embodiment of the invention, a light emitting apparatus includes a luminescent phosphor material and a composite material. The luminescent phosphor material is capable of emitting light with a first color. The composite material includes a plurality of quantum dots capable of emitting light with a second color and a silica material encapsulating surfaces of the quantum dots. The first color and the second color are complementary to each other.

In an embodiment of the invention, the luminescent phosphor material is a yellow-emitting phosphor, and the quantum dots are red quantum dots, green quantum dots or a combination thereof.

In an embodiment of the invention, the luminescent phosphor material is a green-emitting phosphor, and the quantum dots are red quantum dots.

In an embodiment of the invention, the luminescent phosphor material is a red-emitting phosphor, and the quantum dots are green quantum dots.

In an embodiment of the invention, the light emitting apparatus includes a projector color wheel, a light emitting diode (LED) device or an optical film.

Based on the above, the invention provides a light emitting apparatus including a projector color wheel and a light emitting diode (LED) device using a composite material. In the projector color wheel, each of the color converters includes the composite material including at least one quantum dot and a silica material. Thus, the composite material including quantum dots is able to improve the color gamut of the light produced by the projector color wheel compared with the color gamut using conventional phosphors. In addition, the thermal stability of the composite material is enhanced by using the silica material to encapsulate the quantum dots. Moreover, the quantum dots are uniformly dispersed in the silica material (e.g., encapsulating material). As a result, the luminescence efficacy of the composite material is improved which is suitable for projector color wheels and surface packaging of photoelectric devices, such as LED devices.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
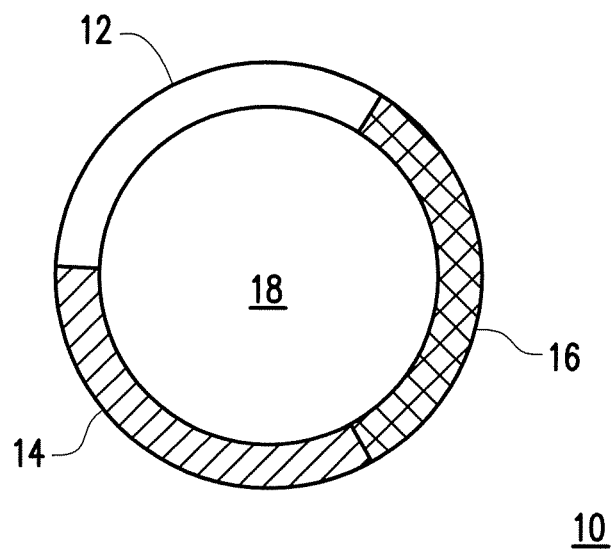
FIG. 1 is a front view illustrating a projector color wheel according to a first embodiment of the invention.

Hereinafter, the invention is illustrated more comprehensively referring to the drawings. However, the invention may be embodied in many different forms and should not be construed as limited to the embodiments set forth herein. Thicknesses of layers and regions in the drawings may be enlarged for clarity. The same or similar reference numbers represent the same or similar components, and are not repeated again in the following paragraphs.

In the present specification, ranges represented by "a numerical value to another numerical value" are schematic representations to avoid listing all of the numerical values in the range in the specification. Therefore, the recitation of a specific numerical range discloses any numerical value in the numerical range and a smaller numerical range defined by any numerical value in the numerical range, as is the case with any numerical value and a smaller numerical range stated expressly in the specification. For instance, the range of "a size of 100 nm to 500 nm" discloses the range of "a size of 200 nm to 350 nm", regardless of whether other numerical values are listed in the specification.

FIG. 1 is a front view illustrating a projector color wheel according to a first embodiment of the invention.

Referring to FIG. 1, the projector color wheel 10 of the first embodiment includes a plurality of different color converter regions 12, 14 and 16 and a rotating portion 18. The color converters 12, 14 and 16 are arranged to form a disk configuration. The rotating portion 18 is disposed at a center of the disk configuration. That is, the color converters 12, 14 and 16 are arranged as an annular shape which surrounds a circumference of the rotating portion 18. Rotation of the rotating portion 18 may drive the projector color wheel 10 to rotate. Specifically, by controlling rotation of the projector color wheel 10 according to the time sequence, an illumination beam from a light source device (not shown) is converted or filtered into various light beams of different colors according to the time sequence when passing through the different color converter regions of the projector color wheel 10.

In some embodiments, the illumination beam from a light source device may be blue illumination beam. The converter regions would separately convert blue illumination beam to green and red beams. In alternative embodiments, illumination beam from a light source device may be short visible (e.g., a wavelength thereof is about 405 nm) or ultraviolet (UV) illumination beam. The converter regions would separately convert Vis or UV illumination beam to blue, green, and red beams.

In some embodiments, the color converter 12 may be an opening, a transparent region without color for letting the illumination beam (for example, a blue illumination beam) to pass through directly without altering color. In alternative embodiments, the color converter 12 may be a reflective surface for letting the illumination beam (for example, a blue illumination beam) to reflect without altering color. The color converters 14 and 16 may include different composite materials, which are called as a first color converter 14 and a second color converter 16 hereinafter. The first color converter 14 may include a first composite material for converting the illumination beam into a first color illumination beam (i.e., to change a wavelength of the illumination beam). On the other hand, the second color converter 16 may include a second composite material for converting the illumination beam into a second color illumination beam. In one embodiment, the first color illumination beam differs from the second color illumination beam. Namely, a wavelength of the first color illumination beam differs from a wavelength of the second color illumination beam. For example, the first color converter 14 may convert the illumination beam into red beam, while the second color converter 16 may convert the illumination beam into green beam. However, the invention is not limited thereto. In another embodiment, the composite materials may be chosen according to the needs of color. In alternative embodiment, a particle size and composition of a quantum dot of the first composite material differs from a particle size and composition of a quantum dot of the second composite material. Although only three color converters are illustrated in FIG. 1, but the invention is not limited thereto. In other embodiments, a number of the color converters and the color of the converters may be adjusted according to the design.

Figures 2A, 2B:
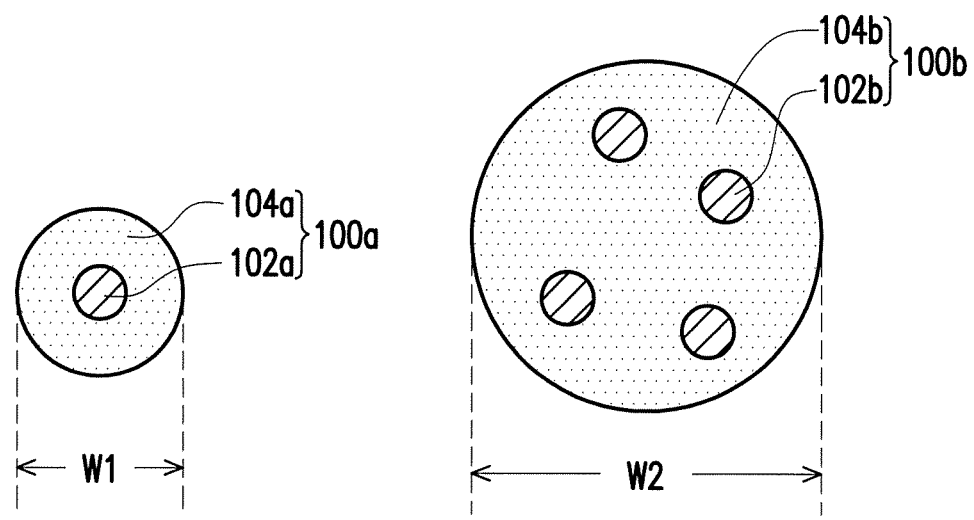
FIG. 2A is a schematic drawing illustrating a composite material according to a second embodiment of the invention.
FIG. 2B is a schematic drawing illustrating a composite material according to a third embodiment of the invention.

FIG. 2A is a schematic drawing illustrating a composite material according to a second embodiment of the invention. FIG. 2B is a schematic drawing illustrating a composite material according to a third embodiment of the invention.

Referring to FIG. 2A and FIG. 2B, each of the foregoing composite materials includes at least one quantum dot and a silica material. In detail, as shown in FIG. 2A, one quantum dot 102a is located in a silica material 104a to form a composite material 100a. That is, a surface of the one quantum dot 102a is encapsulated by the silica material 104a. Similarly, as shown in FIG. 2B, a plurality of quantum dots 102b are dispersed uniformly in a silica material 104b to form a composite material 100b. Surfaces of the quantum dots 102b are encapsulated by the silica material 104b. Although only four quantum dots 102b are illustrated in FIG. 2B, but the invention is not limited thereto. In other embodiments, a number of the quantum dots may be adjusted according to the design.

In one embodiment, a particle size W1 of the composite material 100a is less than a particle size W2 of the composite material 100b. The particle size W1 of the composite material 100a and the particle size W2 of the composite material 100b may respectively range from 10 nm to 500 µm. In another embodiment, the particle size W1 of the composite material 100a and the particle size W2 of the composite material 100b may respectively range from 10 nm to 1 µm.

In some embodiments, the quantum dots 102a and 102b refer to nanostructures that are substantially monocrystalline. However, the invention is not limited thereto. In other embodiment, the quantum dots 102a and 102b refer to nanostructures that are polycrystalline or amorphous.

In some embodiments, the quantum dots 102a and 102b may be core structure, core-shell structure, core-multishell structure, alloy structure, core-alloy layer-shell structure, core-alloy layer-multishell structure, core-gradient alloy-shell structure, or a combination thereof. When the quantum dots 102a and 102b are core-shell structure, each of the quantum dots 102a and 102b includes a core structure and a shell structure covering the core structure. The core structure may be selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof. The shell structure may be selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof. However, the invention is not limited thereto. In other embodiment, the quantum dots 102a and 102b may be perovskite.

In some embodiments, the silica materials 104a and 104b may be a network of alternating crosslinked silicon (Si) and oxygen (O) extending in all possible directions, which may be respectively represented by formula I:

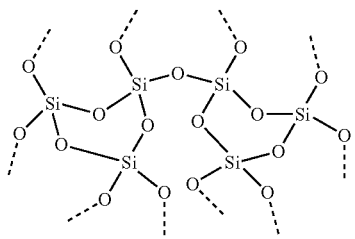

wherein the dotted lines represent continual crosslinked networks of —Si—O—.

In some embodiments, each of the silica materials 104a and 104b may have a particle size of 10 nm to 500 µm. However, the invention is not limited thereto. In other embodiment, the size of the silica materials 104a and 104b may be adjusted according to the needs.

It should be noticed that the quantum dots 102a and 102b are respectively covered by the silica materials 104a and 104b, thus the thermal stability of the composite materials 100a and 100b are enhanced with respect to the conventional quantum dots without silica material covering. In addition, since the projector color wheel of the present invention includes the composite material having quantum dots, the color gamut of the light produced by the projector color wheel of the present invention is enhanced compared with the color gamut using conventional phosphors. Moreover, as shown in FIG. 2B, since the quantum dots 102b are uniformly dispersed in the silica material 104b without aggregation, the luminescence efficacy of the composite material 100b is improved, which is suitable for surface package of photoelectric devices, such as LED devices, and digital light processing (DLP) devices, such as DLP projector color wheels.

In some embodiments, each of the composite materials 100a and 100b further include a silicon resin (not shown) covering a surface of each of the silica materials 104a and 104b. Hence, the thermal stability the composite materials 100a and 100b are further enhanced and enable the composite materials 100a and 100b to be easily moulded into various shapes and sizes depending on the application.

Figure 3:
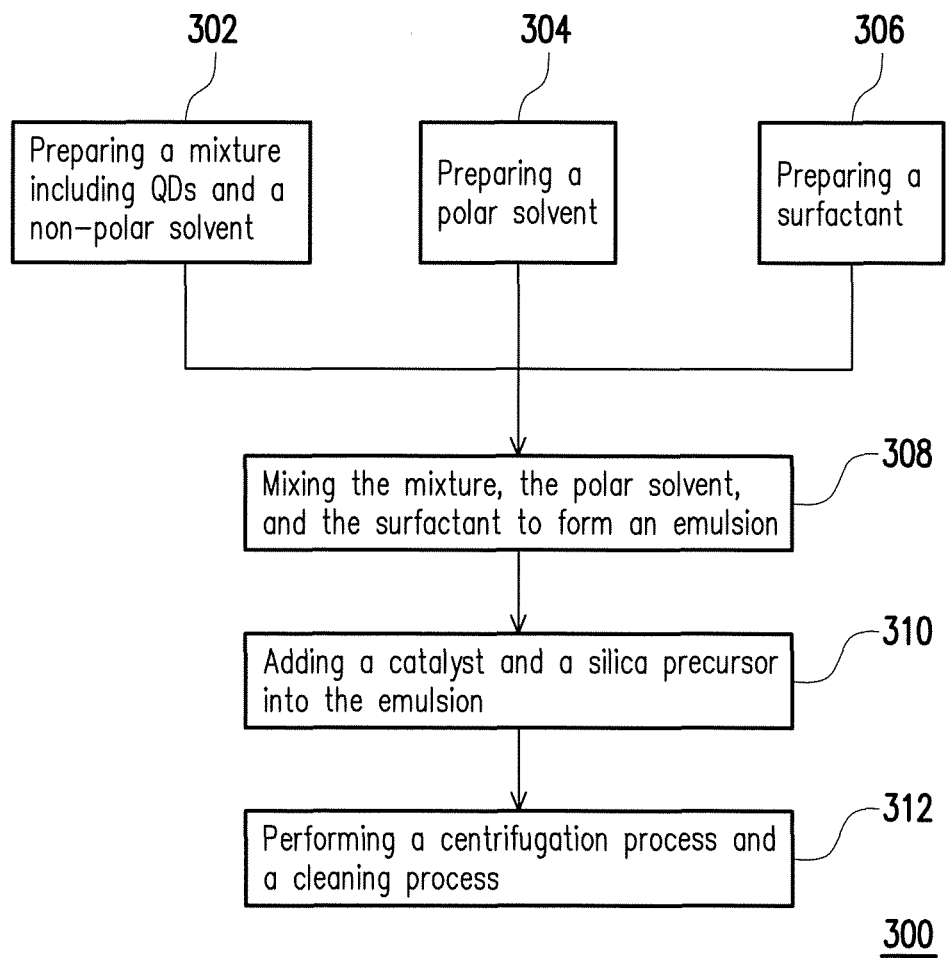
FIG. 3 is a flow-chart drawing illustrating a manufacturing flow of a composite material according to a fourth embodiment of the invention.
Figure 4A:
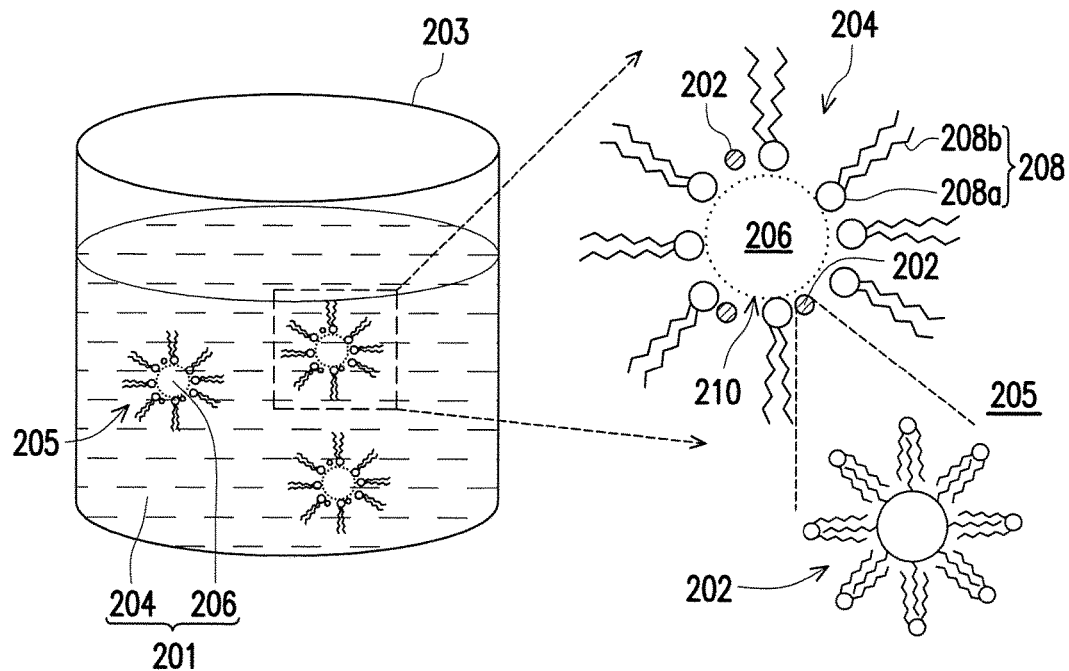
FIG. 4A and FIG. 4B are schematic drawings illustrating the manufacturing flow of the composite material according to FIG. 3.
Figure 4B:
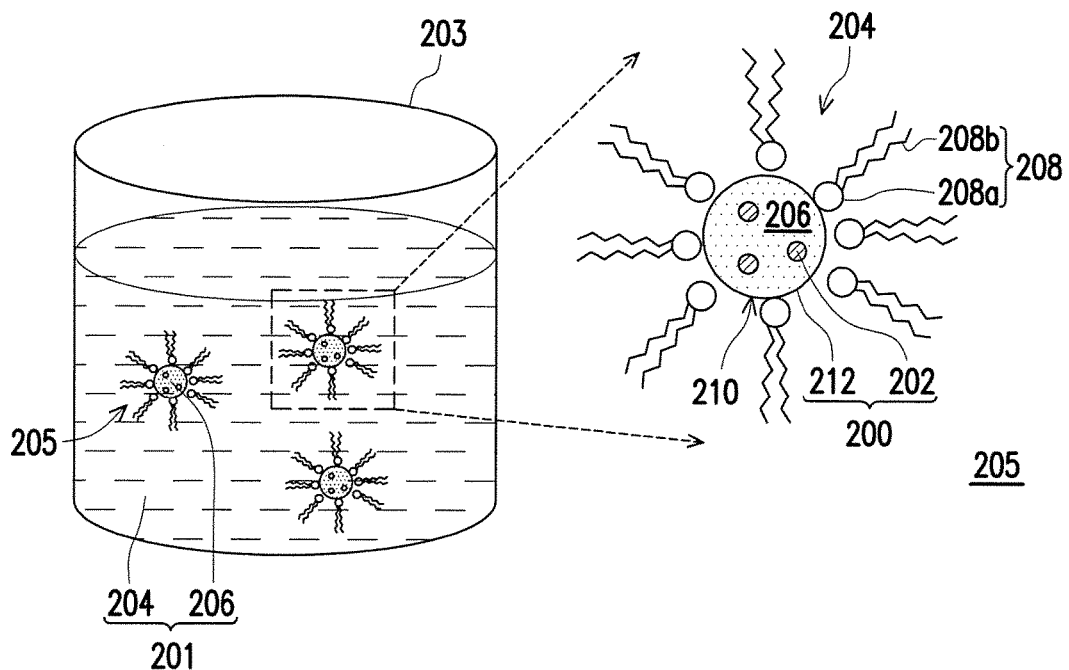

FIG. 3 is a flow-chat drawing illustrating a manufacturing flow of a composite material according to a fourth embodiment of the invention. FIG. 4A and FIG. 4B are schematic drawings illustrating the manufacturing flow of the composite material according to FIG. 3.

Referring to FIG. 3, a method 300 for manufacturing the composite material of the fourth embodiment is as follows. First, a step 302 is performed. A mixture is prepared. The mixture includes a plurality of quantum dots and a non-polar solvent, wherein the quantum dots are dissolved in the non-polar solvent. In some embodiments, the mixture is stirred or sonicated at room temperature (e.g., 25° C.) to fully dissolve the quantum dots. The non-polar solvent may be but not limited to cyclohexane, hexane, toluene, or a combination thereof. In some embodiments, a content of the quantum dots is 0.8-20 wt % and a content of the non-polar solvent is 80-99.2 wt % based on the weight of the mixture (i.e., a sum of the quantum dots and the non-polar solvent).

Next, steps 304 and 306 are performed. A polar solvent and a surfactant are prepared. In some embodiments, the polar solvent may be but not limited to water. The surfactant may include organic compounds that are amphiphilic. That is, the organic compounds contain both hydrophobic groups (e.g., tails) and hydrophilic groups (e.g., heads). Therefore, the surfactant contains both a polar-insoluble (e.g., water-insoluble) or non-polar-soluble (e.g., oil-soluble) component and a polar-soluble (e.g., water-soluble) component. For example, the surfactant will diffuse in water and adsorb at the interface between oil and water, in the case where water is mixed with oil. The water-insoluble hydrophobic group may extend out of the bulk water phase or into the oil phase, while the water-soluble head group remains in the water phase.

Incidentally, the order of the step 302, 304 and 306 can be adjusted according to the needs. That is, after preparing the mixture (i.e., the step 302), the polar solvent and the surfactant are prepared (i.e., the steps 304 and 306); however, the invention is not limited thereto. In one embodiment, the steps 304 and 306 may be performed first, and then the step 302 is performed. In alternative embodiment, the steps 302, 304 and 306 may be performed at the same time.

Step 308 is then performed. The mixture, the polar solvent and the surfactant are mixed to form an emulsion. Referring to FIG. 4A, after mixing the mixture, the polar solvent and the surfactant in a container 203, an emulsion 201 is formed in the container 203. The emulsion 201 may include a plurality of dispersed phases 206 and a continuous phase 204. The dispersed phases 206 are dispersed in the continuous phase 204. As shown in the enlarged view of FIG. 4A, one of the dispersed phases 206 and part of the continuous phase 204 constitute single micelle 205. A plurality of micelles 205 are dispersed uniformly in the emulsion 201. In addition, the micelle 205 also includes a plurality of surfactant compounds 208. Each of the surfactant compounds 208 includes a hydrophilic group 208$a$ and a hydrophobic group 208$b$. Since the dispersed phases 206 include the foregoing polar solvent, the hydrophilic groups 208$a$ face toward interfaces 210 between the dispersed phases 206 and the continuous phase 204. On the other hand, since the continuous phase 204 includes the foregoing non-polar solvent, the hydrophobic groups 208$b$ are away from the interfaces 210. As a result, the surfactant compounds 208 are arranged as a spherical shape. Moreover, a plurality of quantum dots 202 are also included in the emulsion 201. The quantum dot surface changes from non-polar to polar when surrounded by surfactant molecules. During mixing the mixture, the quantum dots with polar surfaces tend to move from the less polar continuous phase 204 to the more polar dispersed phase 206 that is surrounded by the hydrophilic groups of the surfactants.

Referring back to FIG. 3 and FIG. 4B, a step 310 is then performed. A catalyst and a silica precursor are added into the emulsion 201 to form a plurality of composite materials 200 in the dispersed phases 206 respectively. Each of the composite materials 200 includes quantum dots 202 and a silica material 212 (i.e., the silica precursor after performing the step 310). The quantum dots 202 are dispersed uniformly in the silica material 212. In particular, steps of adding the catalyst and the silica precursor may include a hydrolysis, a condensation and a polymerization. During the hydrolysis, the silica precursor is fully hydrolyzed or partially hydrolyzed by $H_2O$ from the foregoing polar solvent, so as to form siloxane compounds with hydroxyl groups (OH groups) attached on Si of the siloxane compounds. The hydrolysis scheme (1) is represented as below.

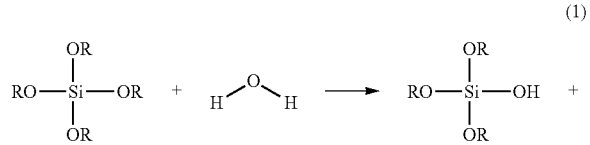

(1)

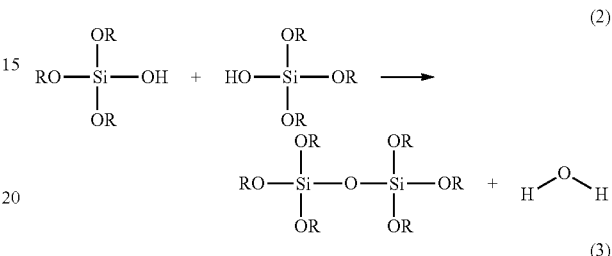

wherein each R is independently selected from the group consisting of $C_{1-8}$ alkyl, cycloalkyl and aryl.

Then, during the condensation, two or more of the fully hydrolyzed or partially hydrolyzed siloxane compounds are bonded together. The condensation scheme (2) or (3) is represented as below.

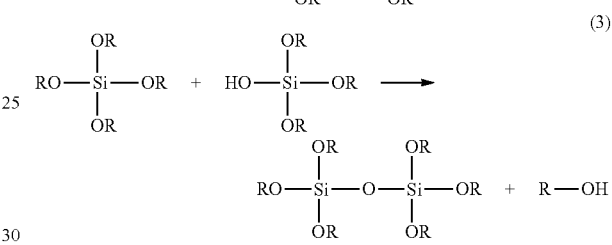

wherein each R is independently selected from the group consisting of C1-8 alkyl, cycloalkyl and aryl.

During the polymerization, one hydrolysis and one condensation are repeated one or more times to form the foregoing silica materials.

In some embodiment, the catalyst may be a base. The base may be but not limited to ammonia, ammonium fluoride, sodium hydroxide or a combination thereof. The silica precursor may include tetramethyl orthosilicate (TMOS), tetraethyl orthosilicate (TEOS), or a combination thereof. The catalyst are polar molecules situated in the polar dispersed phase 206, which is generally separated from the non-polar silica precursor in the non-polar continuous phase 204. During mixing, silica precursor and catalyst will come into contact at the polar and non-polar interface due to the random movements of the molecules and initiate the polymerization reaction. Thus the silica materials 212 tend to surround the quantum dots 202 in the polar dispersed phase 206, forming the foregoing composite materials 200. It should be noted that a number of the quantum dots 202 in each of the silica materials can be controlled by the weight ratio of the quantum dots 202 and the silica precursor. In addition, the particle size of each of the composite materials 200 can also be controlled by the size of each of the micelles 205. That is, the composite materials 200 having similar or the same particle size can be obtained according to the foregoing method of the present invention. Each of the composite materials 200 may have similar or the same number of the quantum dots 202 therein. In some embodiments, the weight ratio of the quantum dots 202 to the silica precursor ranges from 1:1 to 1:200.

After performing the step 310, a step 312 is performed. A centrifugation process and at least one cleaning process are performed to collect the precipitate of the composite materials 200. In some embodiments, the cleaning process may include using ethanol to wash resulting products after performing the centrifugation process.

In one embodiment, the composite materials 200 may be mixed with silicone and disposed onto a LED chip. The silicone may be a commercially available silicone (e.g., Dow Corning® OE-6370). More specifically, the LED chip is one component of a LED device. The LED device may include a substrate with a cavity and the LED chip disposed in the cavity of the substrate. The composite material formed from foregoing method 300 is mixed with silicone and filled in the cavity of the substrate and covers a surface of the LED chip. The composite material includes a plurality of quantum dots. The quantum dots may emit red, green, blue or any other colored lights desired. The quantum dots are able to absorb light energy emitted from the LED chip and re-emit the absorbed energy as light of a different wavelength. The quantum dots may have variously-regulated light emitting wavelengths. For example, one white LED device may be fabricated by combining red and green quantum dots with a blue LED chip. Alternatively, another white LED device may be fabricated by combining red, green, and blue quantum dots with a short visible (Vis) or an ultraviolet (UV) LED chip.

It should be noted that the silica material used in the LED device may be a modification-free silica material. Specifically, the modification-free silica material is able to react with the silicone without any additional functional groups, such as methacrylate, vinyl, vinyl acetate, alkene, thiol, or a combination thereof. If the silica material is modified with an additional functional group, propylmethacrylate (as in TMOPMA) for example, the thermal stability of the composite material formed is decrease (see FIG. 10). That is, the composite material having the modified silica material is not suitable for surface package of the light emitting apparatus, such as the LED device. On the other hand, the composite material of the embodiment having the modification-free silica material, thus the thermal stability of the composite material formed is enhanced (see FIG. 10).

In alternative embodiment, the composite materials 200 may be used as color converters of a projector color wheel. Since the quantum dots 202 are encapsulated by the silica material 212, the thermal endurance of the composite material 200 are enhanced. Therefore, the color gamut of a projector is not only improved, the luminance property of the quantum dots 202 disposed in the projector color wheel of the projector is also maintained.

In addition, the composite materials 200 may be mixed with luminescent phosphor material, so as to supplement the deficiency of the luminescent phosphor material and thus increase the color gamut of the light emitting apparatus, such as the projector color wheel or the LED device. In detail, a mixture includes the luminescent phosphor material and the composite material. The luminescent phosphor material is capable of emitting light with a first color. The composite material includes a plurality of quantum dots capable of emitting light with a second color and a silica material encapsulating surfaces of the quantum dots. The first color and the second color are complementary to each other.

In one embodiment, the luminescent phosphor material may be a yellow-emitting or green-emitting phosphor material with dominant emission wavelength of 500 nm to 600 nm, such as yttrium aluminium garnet (YAG; $Y_3Al_5O_{12}$:$Ce^{3+}$), silicate (($Ba, Sr)_2SiO_4$:$Eu^{2+}$), β-SiAlON ($Si_{6-z}Al_zO_zN_{8-z}$:$Eu^{2+}$), or γ-AlON ($Al_{1.7}O_{2.1}N_{0.3}$:$Mn^{2+},Eu^{2+}$). Due to its deficiency in emitting red color, a red-emitting quantum dot encapsulated in silica material (dominant emission wavelength of 600 nm to 650 nm) may be used to supplement this deficiency and thus increase the color gamut of the final luminescent composite material. For example, when the luminescent phosphor material is a yellow-emitting phosphor, and the quantum dots may be red quantum dots, green quantum dots or a combination thereof. In some embodiments, when the luminescent phosphor material is a green-emitting phosphor, and the quantum dots may be red quantum dots. In alternative embodiments, the luminescent phosphor material may be a red-emitting phosphor material with dominant emission wavelength of 590 nm to 680 nm, such as $CaAlSiN_3$:$Eu^{2+}$ or KSF ($K_2SiF_6$:$Mn^{4+}$). Due to its deficiency in emitting green color, a green-emitting quantum dot encapsulated in silica material (dominant emission wavelength of 500 nm to 550 nm) may be used to supplement this deficiency and thus increase the color gamut of the final luminescent composite material.

Figure 11:
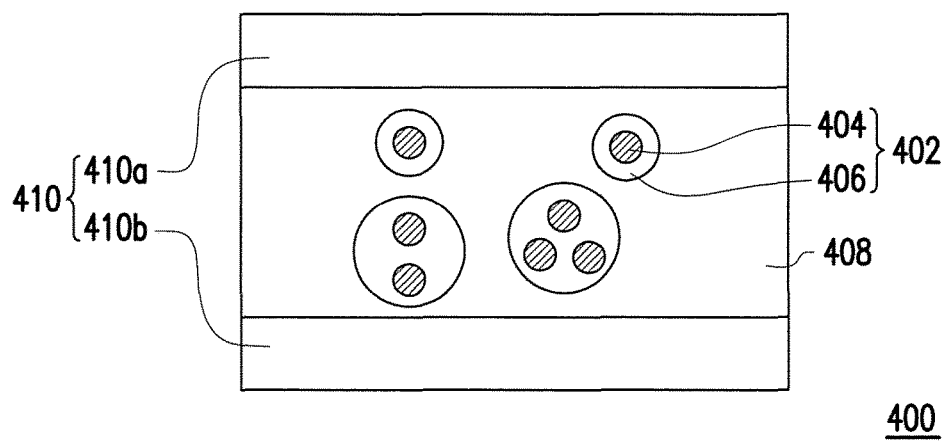
FIG. 11 is a schematic drawing illustrating an optical film according to an embodiment of the invention.

FIG. 11 is a schematic drawing illustrating an optical film according to an embodiment of the invention.

Furthermore, the composite materials 200 may exist in the form of a film. Specifically, as shown in FIG. 11, an optical film 400 includes a first component 402, a second component 408 and a third component 410. The first component 402 includes one or more quantum dots 404 and a silica material 406 encapsulating surfaces of the one or more quantum dots 404. The second component 408 includes a UV curable composite material. The third component 410 includes two PET (polyethylene terephthalate) substrate sheets 410a and 410b that sandwich the first component 402 and the second component 408 in between. The first component 402 is dispersed in the second component 408. In some embodiments, the UV curable composite material may include 2-phenylethyl methacrylate, triaryl isocyanurate (TAIC), diallyl phthalate, and a photoinitiator. In addition, the one or more quantum dots 404 are encapsulated by the silica material 406, thus, the silica material 406 is able to prevent oxygen and water vapor from contacting the dispersed quantum dots 404. Compared with organic material, such as polymer or resin, the silica material 406 has a better effect of preventing oxygen and water vapor. Therefore, the optical film 400 is able to be directly used in a light emitting apparatus without using expensive gas barrier layers on the third component (PET sheets) 410 to protect the optical film 400.

In order to improve reliability of the invention, the following lists several examples and several comparative examples to illustrate the composite material of the invention further. Although the following experiments are described, the material used and the amount and ratio of each thereof, as well as handling details and handling procedures, etc., can be suitably modified without exceeding the scope of the invention. Accordingly, restrictive interpretation should not be made to the invention based on the embodiments described below.

Experimental Example 1

Figure 5:
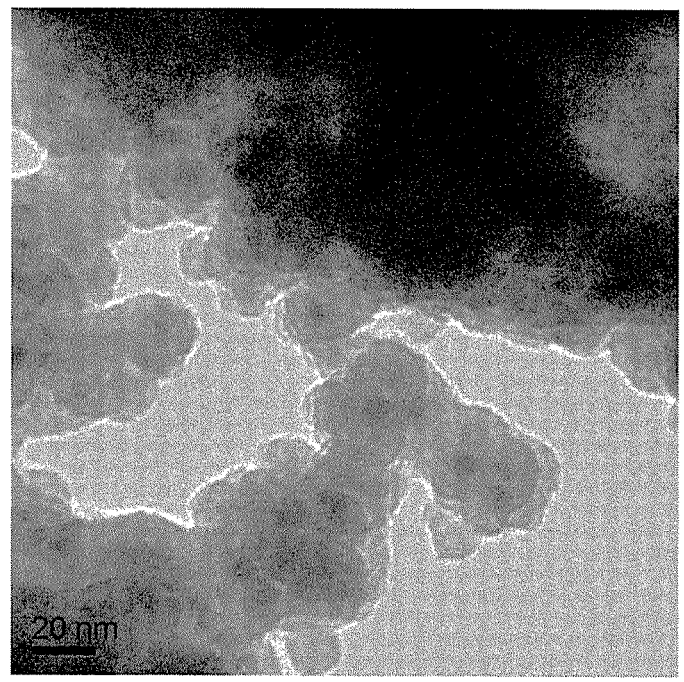
FIG. 5 is a transmission electron microscopy (TEM) image of a composite material of Experimental example 1.

CdSe/ZnS quantum dots (200 mg; prepared according to literature procedures) are dissolved in 50 ml of cyclohexane to form a mixture. Igepal CO-520 (purchased from Sigma-Aldrich) is added in the mixture, wherein a weight ratio of quantum dot to Igepal CO-520 is 1:5. Water (50 ml) is added and stirred at room temperature (about 25° C.) until half of the liquid evaporated. Ammonia (384 μl) and ethyl acetate (2 ml) is then added and mixed homogenously before 320 μl of tetraethyl orthosilicate (TEOS) is added and reacted for 8 hours. After the reaction, the precipitate is collected by centrifugation and then washed with ethanol three to five times. The precipitate is dried in the oven at 70° C. for one hour to form a composite material of Experimental example 1. The composite material of Experimental example 1 is characterized by transmission electron microscopy (TEM). As shown in FIG. 5, the CdSe/ZnS quantum dots are encapsulated by the silica.

Experimental Example 2

In the following, the manufacturing method of composite materials of Experimental example 2 to Experimental example 4 are conducted in similar methods described as Experimental example 1.

Figure 6A:
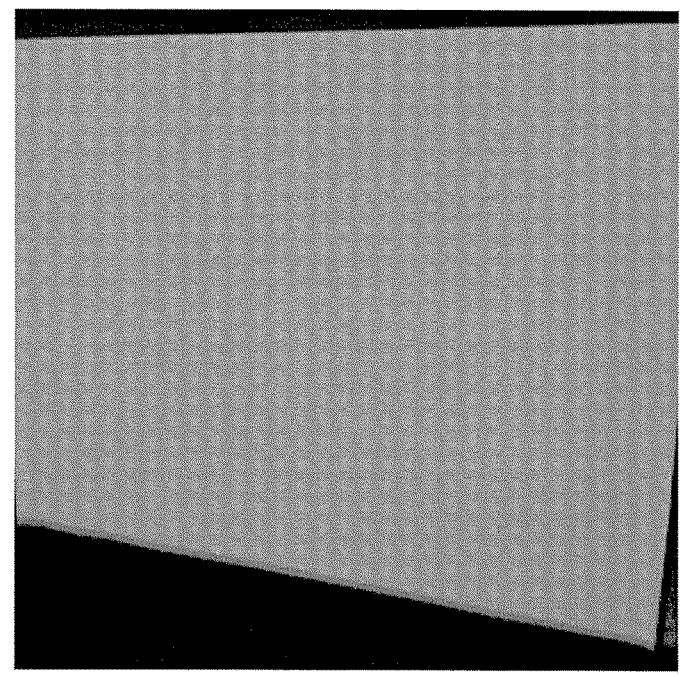
FIG. 6A is a green test screen from DLP projector of Experimental example 2.

The composite material of Experimental example 2 includes green CdSe/ZnS quantum dots and silica ($SiO_2$), wherein the green CdSe/ZnS quantum dots are encapsulated by silica. Then, 5 wt % of composite material of Experimental example 2 and 95 wt % of two-part silicone (Dow Corning® OE-6370) are mixed, then applied onto a section of a digital light processing (DLP) projector color wheel and cured at 100° C. for 3 hours. The projector color wheel was then installed into a DLP projector to produce green test screen. As shown in FIG. 6A, a green test screen was produced successfully using silica encapsulated green quantum dots, showing that the silica encapsulation allowed the green quantum dots to survive the extreme environment (e.g., high temperature up to 180° C.) inside the projector.

Experimental Example 3

Figure 6B:
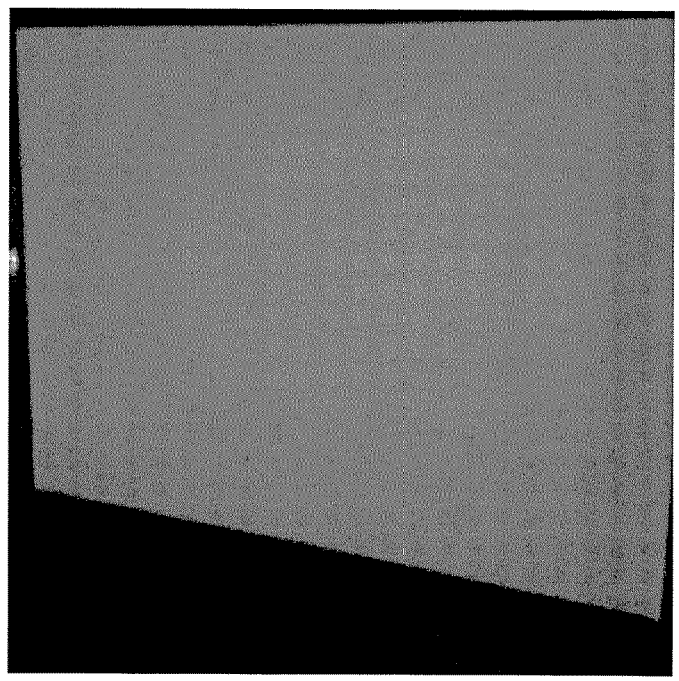
FIG. 6B is a red test screen from DLP projector of Experimental example 3.

The composite material of Experimental example 3 includes red CdSe/ZnS quantum dots and silica ($SiO_2$), wherein the red CdSe/ZnS quantum dots are encapsulated by silica. Then, 5 wt % of composite material of Experimental example 3 and 95 wt % of two-part silicone (Dow Corning® OE-6370) are mixed, then applied onto a section of a digital light processing (DLP) projector color wheel and cured at 100° C. for 3 hours. The projector color wheel was then installed into a DLP projector to produce red test screen. As shown in FIG. 6B, a red test screen was produced successfully using silica encapsulated red quantum dots, showing that the silica encapsulation also allowed the red quantum dots to survive the extreme environment (e.g., high temperature up to 180° C.) inside the projector.

Experimental Example 4

Figure 7:
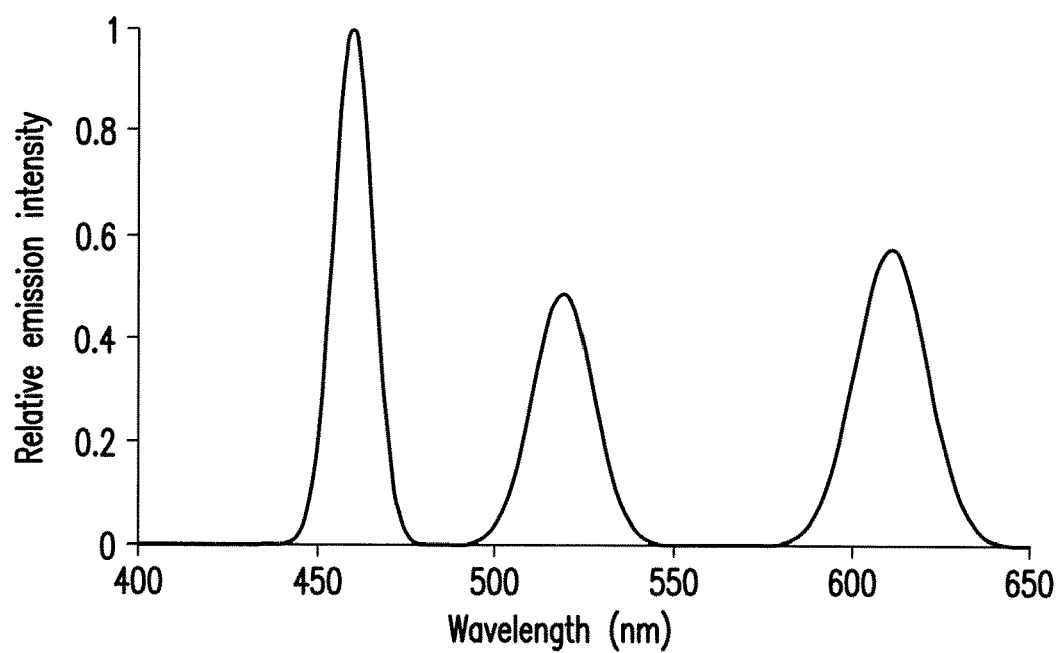
FIG. 7 is a LED output spectrum of Experimental example 4.

4 wt % of green CdSe/ZnS quantum dots encapsulated by silica, 1 wt % of red CdSe/ZnS quantum dots encapsulated by silica and 95 wt % of two-part silicone (Dow Corning® OE-6370) are mixed to form a mixture. The mixture is dispensed onto a blue LED chip (i.e., an emission wavelength thereof is 440~460 nm) and cured at 100° C. for 3 hours. The LED output spectrum is shown in FIG. 7. As shown in FIG. 7, the silica encapsulated quantum dots are able to convert the source blue light from the LED chip to green and red lights.

Comparative Example 1

Reverse Emulsion Synthesis of Silica Beads Embedded with Quantum Dots

A solution of CdSe/ZnS core/shell quantum dots (containing 70 mg of inorganic material) was subjected to evaporation to remove most of the solvent, which in this case was toluene, and then mixed with silane monomers (e.g., 0.1 mL of 3-(trimethoxysilyl)propylmethacrylate (TMOPMA) and 0.5 mL of tetramethoxy silane (TEOS)) until a clear solution was obtained.

10 mL of degassed cyclohexane/Igepal™ CO-520 (CO-520 is $C_9H_{19}$-Ph-$(OCH_2CH_2)_n$—OH where n=5) (18 mL/1.35 g) was prepared in a 50 mL flask and 0.1 mL of 4% $NH_4OH$ injected to form a stable reverse emulsion. The Cyclohexane/CO-520/$NH_4OH$ mixture was then mixed with the quantum dots/silane monomers mixture and stirred at 500 rpm under $N_2$ overnight. Modified silica beads containing quantum dots were recovered by centrifugation and washed with cyclohexane twice. The resulting sediment was then dried under vacuum.

Experimental Example 5

CdSe/ZnS quantum dots (200 mg; prepared according to literature procedures) are dissolved in 50 ml of cyclohexane to form a mixture. Igepal CO-520 (purchased from Sigma-Aldrich) is added in the mixture, wherein a weight ratio of quantum dot to Igepal CO-520 is 1:5. Water (50 ml) is added and stirred at room temperature (about 25° C.) until half of the liquid evaporated. Ammonia (384 µl) and ethyl acetate (2 ml) is then added and mixed homogenously before 210 µl of tetramethyl orthosilicate (TMOS) is added and reacted for 8 hours. After the reaction, the precipitate is collected by centrifugation and then washed with ethanol three to five times. The precipitate is dried in the oven at 70° C. for one hour to form a composite material of Experimental example 5.

LED Lifetime Test

Quantum dots encapsulated by modification-free silica were synthesized according to Experimental example 5 and were mixed with a two-part silicone (Dow Corning® OE-6370). The mixture was dispensed onto a blue LED chip (i.e., an emission wavelength thereof is 440~460 nm) and cured at 100° C. for 3 hours. The fabricated LEDs were tested and continuously powered with a forward current of 20 mA. The LED efficacy (e.g., blue light from the LED plus green and red lights emitted by quantum dots) in lumen and quantum dots photoluminescence (PL) intensity (e.g., green and red lights emitted by quantum dots only) was measured periodically using a photometric integrating sphere (diameter=10 cm) with a spectral light meter (OPTIMUM SRI-2000).

Similarly, quantum dot-containing silica microbeads prepared as Comparative example 1 can be mixed with an LED encapsulant (e.g., Shin Etsu SCR1011 or Shin Etsu SCR1016) using sufficient stirring to ensure good dispersion within the encapsulating polymer. The encapsulant mixture was dispensed then onto a blue LED chip (i.e., an emission wavelength thereof is 440~460 nm) and cured under an inert atmosphere using standard conditions for the LED encapsulant used. The fabricated LEDs were tested and continuously powered with a forward current of 20 mA. The LED efficacy (e.g., blue light from the LED plus green and red lights emitted by quantum dots) in lumen and quantum dots photoluminescence (PL) intensity (e.g., green and red lights emitted by quantum dots only) was measured periodically using a photometric integrating sphere (diameter=10 cm) with a spectral light meter (OPTIMUM SRI-2000).

Figure 10:
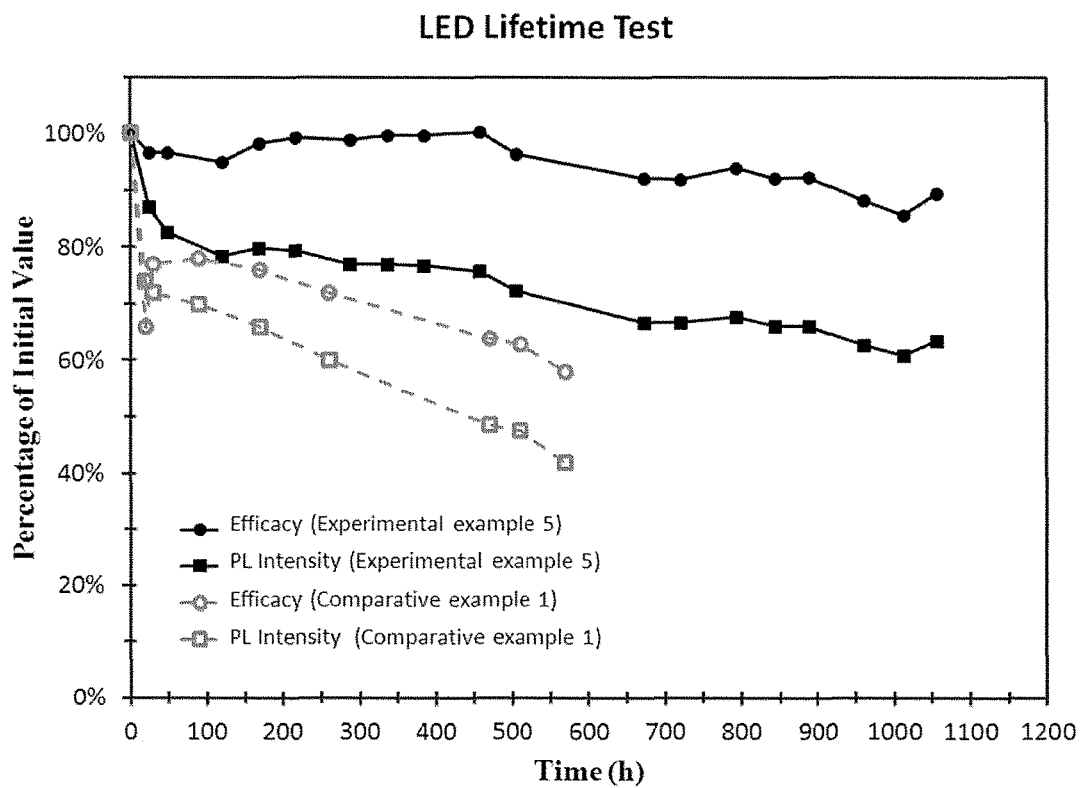
FIG. 10 is a plot of LED efficacy of Experimental example 5 and Comparative example 1.

FIG. 10 is a plot of LED efficacy and quantum dot photoluminescence (PL) intensity of LED with modification-free silica encapsulated quantum dots (Experimental examples 5) or LED with modified silica encapsulated quantum dots (Comparative example 1). As can be seen in FIG. 10, the efficacy of LED with modification-free silica encapsulated quantum dots does not exhibit a sharp initial decrease as shown by LED with modified silica encapsulated quantum dots. Furthermore, LED with modification-free silica encapsulated quantum dots exhibited less decrease in efficacy and photoluminescence (PL) throughout the whole test period. This clearly illustrated that quantum dots encapsulated by modification-free silica material (Experimental examples 5) are more stable than quantum dots encapsulated by modified silica material (Comparative example 1).

Experimental Example 7

Color Wheel Application

Red CdSe/ZnS QDs encased in silica (10 wt %) and yellow yttrium aluminium garnet (YAG) phosphor (40 wt %) mixed with two-part silicone (Dow Corning® OE-6370; 50 wt %) was applied on a section of the color wheel and cured at 100° C. for 3 hours. The color wheel was then installed into a DLP projector. The silica encapsulated red quantum dots are able to supplement the deficiency of red color from YAG phosphor, and improve the color gamut of the projector.

Experimental Example 8

LED Application

Figure 8:
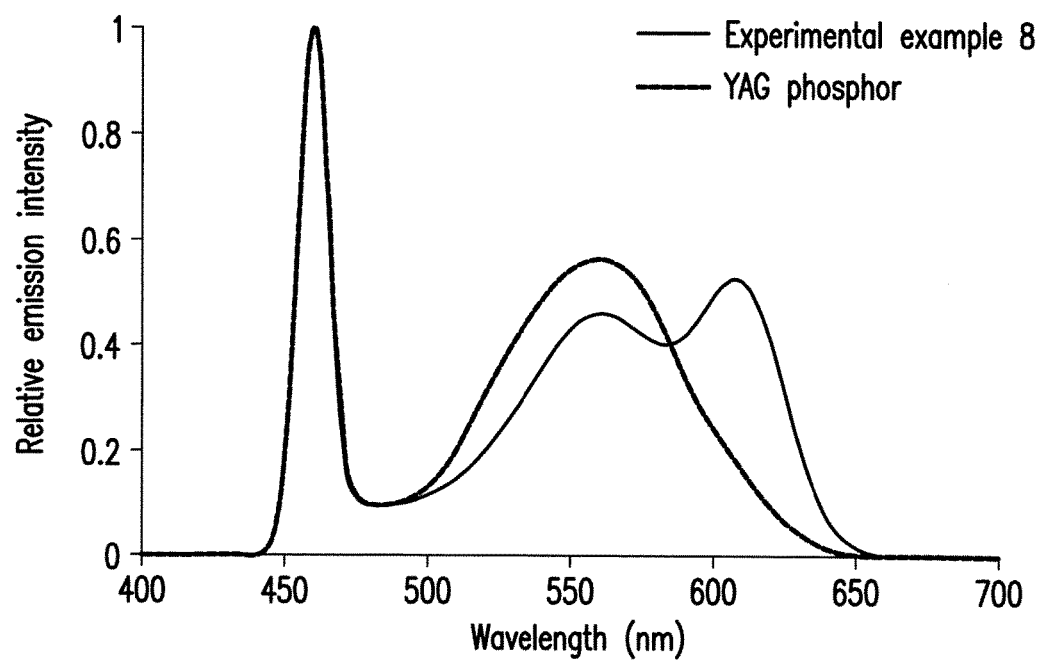
FIG. 8 is a LED output spectrum of Experimental example 8.

Silica encapsulated red quantum dots (3 wt %), yellow yttrium aluminium garnet (YAG) phosphor (5 wt %), and silicone (Dow Corning® OE-6370; 92 wt %) are mixed to form a mixture. The mixture is dispensed onto a blue LED chip (i.e., an emission wavelength thereof is 440~460 nm) and cured at 100° C. for 3 hours. The LED output spectrum is shown in FIG. 8. As shown in FIG. 8, the silica encapsulated red quantum dots are able to supplement the deficiency of red color from YAG phosphor (see the dotted line in FIG. 8), leading to an improved color gamut.

Experimental Example 9

Silica encapsulated red quantum dots (3 wt %) and green quantum dots (10 wt %) are mixed with a UV curable composite material comprising AG-F-26729 (48 wt %; Angene), TAIC™ (24 wt %; Nippon Kasei Chemical), DAISO DAP™ (14 wt %; Osaka Soda) and Darocur® TPO (1 wt %; Ciba Specialty Chemicals Inc.). The mixture (100 µm thick) is sandwiched between two polyethylene terephthalate (PET) sheets (100 µm thick each) and exposed to UV light (370 nm, 400 W, 2 minutes) to form an optical thin film. The optical thin film was installed into a 7-inch blue (445 nm) backlight unit and stored at 85° C. with the light power constantly switched on (2.4 mW/cm$^2$) for 1000 hours. The luminescence intensity test of the backlight unit is measured with a Konica Minolta CS-100 meter at different time interval.

Figure 9:
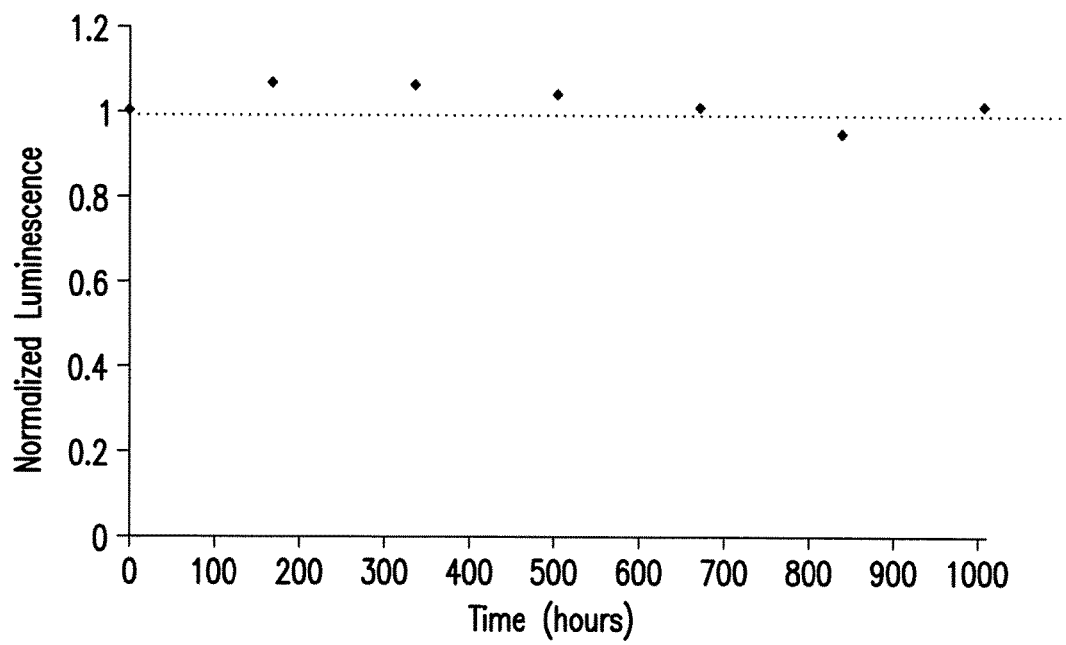
FIG. 9 is a luminescence intensity of Experimental example 9.

As shown in FIG. 9, the luminescence intensity of the backlight unit remained constant throughout the test. This clearly illustrated that there was no decay in the photoluminescence of the optical film inside the backlight unit.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A projector color wheel comprising:
a plurality of color converters arranged to form a disk configuration, wherein each of the color converters comprises a composite material comprising at least one quantum dot and a silica material encapsulating a surface of the at least one quantum dot, wherein a number of the at least one quantum dot is plural, and a plurality of quantum dots are dispersed uniformly in the silica material; and
a rotating portion disposed at a center of the disk configuration.

2. The projector color wheel according to claim 1, wherein the color converters are arranged as an annular shape which surrounds a circumference of the rotating portion.

3. The projector color wheel according to claim 1, wherein one of the color converters is an opening for permitting light to pass through the opening or a reflective surface for permitting light to reflect without changing the color of the light beam.

4. The projector color wheel according to claim 1, wherein the color converters comprise a first color converter having a first composite material and a second color converter having a second composite material, and the first composite material differs from the second composite material.

5. The projector color wheel according to claim 4, wherein an emission wavelength of the at least one quantum dot of the first composite material differs from an emission wavelength of the at least one quantum dot of the second composite material.

6. The projector color wheel according to claim 1, wherein the at least one quantum dot comprises core structure, core-shell structure, core-multishell structure, alloy structure, core-alloy layer-shell structure, core-alloy layer-multishell structure, core-gradient alloy-shell structure, or a combination thereof.

7. The projector color wheel according to claim 1, wherein the at least one quantum dot comprises a core structure and a shell structure covering the core structure,
the core structure is selected from the group consisting of CdS, CdSe, CdTe, ZnS, ZnSe, ZnTe, HgS, HgSe, HgTe, GaN, GaP, GaAs, InP, InAs, InSb, AlN, AlP, AlAs, AlSb, SiC, Fe, Pt, Ni, Co, Al, Ag, Au, Cu, FePt, Si, Ge, PbS, PbSe, PbTe, and alloys thereof, and
the shell structure is selected from the group consisting of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe, and alloys thereof.

8. The projector color wheel according to claim 1, wherein the at least one quantum dot comprises perovskite.

9. The projector color wheel according to claim 1, wherein the composite material further comprises a silicon resin covering a surface of the silica material, so as to enhance the thermal stability of the color converters and be easily mould into suitable shapes and sizes.

10. A light emitting diode (LED) device comprising:
a LED chip; and
a composite material disposed onto and in direct contact with the LED chip, wherein the composite material comprises a plurality of quantum dots and a silica material encapsulating surfaces of the quantum dots, and the quantum dots are dispersed uniformly in the silica material.

11. The LED device according to claim 10, wherein the silica material comprises an inorganic polymer made from tetramethyl orthosilicate (TMOS) or tetraethyl orthosilicate (TEOS).

12. The LED device according to claim 10, wherein the composite material is capable of withstanding a temperature of 25° C. to 260° C.

13. A light emitting apparatus comprising:
a luminescent phosphor material capable of emitting light with a first color; and
a composite material comprising a plurality of quantum dots capable of emitting light with a second color and a silica material encapsulating surfaces of the quantum dots, wherein the quantum dots are dispersed uniformly in the silica material and the first color and the second color is complementary to each other.

14. The light emitting apparatus according to claim 13, wherein the luminescent phosphor material is a yellow-emitting phosphor, and the quantum dots are red quantum dots, green quantum dots or a combination thereof.

15. The light emitting apparatus according to claim 13, wherein the luminescent phosphor material is a green-emitting phosphor, and the quantum dots are red quantum dots.

16. The light emitting apparatus according to claim 13, wherein the luminescent phosphor material is a red-emitting phosphor, and the quantum dots are green quantum dots.

17. The light emitting apparatus according to claim 13, wherein the light emitting apparatus comprises a projector color wheel, a light emitting diode (LED) device or an optical film.

* * * * *